(12) United States Patent
Kim

(10) Patent No.: US 7,579,625 B2
(45) Date of Patent: Aug. 25, 2009

(54) CMOS IMAGE SENSOR AND METHOD FOR MANUFACTURING THE SAME

(75) Inventor: Duk Soo Kim, Gwangju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 9 days.

(21) Appl. No.: 11/616,054

(22) Filed: Dec. 26, 2006

(65) Prior Publication Data

US 2007/0145504 A1 Jun. 28, 2007

(30) Foreign Application Priority Data

Dec. 28, 2005 (KR) ...................... 10-2005-0132608

(51) Int. Cl.
*H01L 31/0232* (2006.01)
(52) U.S. Cl. .................. 257/72; 257/291; 257/292; 257/432; 257/E27.132; 257/E27.134; 438/432
(58) Field of Classification Search ................ 257/432, 257/291–292; 438/70–71, 631
See application file for complete search history.

(56) References Cited

U.S. PATENT DOCUMENTS

| | | | | |
|---|---|---|---|---|
| 5,708,264 A | * | 1/1998 | Hawkins et al. | ............. 250/226 |
| 2006/0145223 A1 | * | 7/2006 | Ryu | ........................... 257/294 |
| 2006/0187381 A1 | * | 8/2006 | Yokozawa | ................... 349/106 |
| 2007/0145439 A1 | * | 6/2007 | Han | ............................ 257/291 |

FOREIGN PATENT DOCUMENTS

| | | | |
|---|---|---|---|
| CN | 1482501 | | 3/2004 |
| CN | 1607675 | | 4/2005 |
| JP | 2002-184965 | * | 6/2002 |
| KR | 10-2001-0037405 | | 1/2003 |

* cited by examiner

*Primary Examiner*—Ahmed Sefer
(74) *Attorney, Agent, or Firm*—Saliwanchik, Lloyd & Saliwanchik

(57) ABSTRACT

A CMOS image sensor is provided. The CMOS image sensor can include: a plurality of photodiodes formed on a semiconductor substrate; an interlayer dielectric layer formed on an entire surface of the semiconductor substrate having the plurality of photodiodes; color filter layers including multi-layered blue color filter layers formed on the interlayer dielectric layer corresponding to respective photodiodes of the plurality of photodiodes; a planarization layer formed on the semiconductor substrate having the color filter layers; and microlenses formed on the planarization layer.

6 Claims, 4 Drawing Sheets

CMOS IMAGE SENSOR AND METHOD FOR MANUFACTURING THE SAME

RELATED APPLICATION(S)

This application claims priority under 35 U.S.C. §119(e) of Korean Patent Application No. 10-2005-0132608 filed Dec. 28, 2005, which is incorporated herein by reference in its entirety.

FIELD OF THE INVENTION

The present invention relates to a CMOS image sensor and a method for manufacturing the same.

BACKGROUND OF THE INVENTION

In general, an image sensor is a semiconductor device for converting an optical image into an electric signal, and is mainly classified as a Charge Coupled Device (CCD) image sensor or a Complementary Metal Oxide Semiconductor (CMOS) image sensor.

The CMOS image sensor includes a photodiode for detecting light and a CMOS logic circuit for converting detected light into electric signals to form image data. As the quantity of light received in the photodiode increases, the photosensitivity of the image sensor is improved.

To improve the photosensitivity, either a fill factor, which is a ratio of a photodiode area to the whole area of the image sensor, must be increased, or a photo-gathering technology is used to change the path of light incident onto an unintended area such that the light can be gathered in the photodiode.

A representative example of the photo-gathering technology is to make a microlens. That is, a convex microlens is formed on a top surface of the photodiode using a material having superior light transmittance, thereby refracting the incident light in such a manner that a greater amount of light can be transmitted into the photodiode area.

In this case, light parallel with an optical axis of the microlens is refracted by the microlens so that the light is focused on a certain position of the optical axis.

Hereinafter, a conventional CMOS image sensor is described with reference to the accompanying drawing.

FIGS. 1a to 1d are cross-sectional views illustrating the procedure of manufacturing a conventional CMOS image sensor.

Referring to FIG. 1a, an interlayer dielectric layer 13 is formed on a semiconductor substrate having a plurality of light sensing elements, e.g., photodiodes 12.

Here, the interlayer dielectric layer 13 may be formed as multiple layers. Although not shown in the figure, after one interlayer dielectric layer is formed, a light shielding layer is formed to prevent light from being incident onto a portion other than the photodiode region, and then another interlayer dielectric layer is formed thereupon.

Then, a dyeable resist is applied on the interlayer dielectric layer 13, and color filter layers 14 for filtering light for each wavelength band are then formed by performing an exposure and development process.

Subsequently, a planarization layer 15 is formed on the color filter layers in order to adjust a focus distance and secure a planarity for forming a microlens layer.

As shown in FIG. 1b, a resist layer 16a for microlenses is applied on the planarization layer 15, and a reticle 17 with openings is aligned above the resist layer 16a.

Subsequently, the resist layer 16a is selectively exposed to correspond to the openings of the reticle 17 by radiating light such as laser onto the semiconductor substrate 11 through the reticle 17.

Referring to FIG. 1c, the exposed resist layer 16a is developed to form microlens patterns 16b.

Referring to FIG. 1d, convex shaped microlenses 16 are formed by reflowing the microlens patterns 16b at a temperature of 150 to 200° C.

The micro lenses 16 allow a larger amount of light to be focused onto the photodiodes 12 by passing the light through the color filter layers 14 according to the wavelengths thereof, when a natural light is incident into the micro lenses 16.

The light incident into the image sensor is focused by the micro lenses 16 and filtered through the color filter layers 14, and then the filtered light is incident onto each photodiode 12 which is correspondingly located below each color filter layer 14.

In a case where such a conventional CMOS image sensor is used for a Digital Still Camera (DSC) in which a thin color pixel is required, a process of forming a color filter layer with a high thickness is performed in order to implement color reproduction.

Accordingly, since all color filter layers for DSC CMOS image sensors have been currently formed in a range of 0.7 to 1.0 μm, color reproduction of colors is low, and sensitivity is the chief consideration. If a color pixel with a high thickness is formed by a one-time process when performing a process of forming a thin color filter layer described above, in particular a blue color filter layer, transmittance for an in-line exposure wavelength (when coating a color photoresist in 0.9 μm or more) is 0.5% or less, and reactivity for light is almost close to zero at a portion contacted with the interlayer dielectric layer 13. For this reason, there is a problem in that the peeling of a color pixel occurs.

BRIEF SUMMARY

Accordingly, it is an object of embodiments of the present invention to provide a CMOS image sensor and a method for manufacturing the same, wherein a thin color pixel can be formed using a double exposure process.

According to one aspect of the present invention, there is provided a CMOS image sensor, which includes: a plurality of photodiodes formed on a semiconductor substrate at a predetermined interval; an interlayer dielectric layer formed on an entire surface of the semiconductor substrate having the photodiodes; color filter layers including multi-layered blue color filter layers formed to correspond to respective photodiodes on the interlayer dielectric layer; a planarization layer formed on the entire surface of the semiconductor substrate having the color filter layers; and microlenses formed on the planarization layer.

A CMOS image sensor and a method for manufacturing the same according to embodiments of the present invention have advantages as follows.

That is, in the CMOS image sensor used for a DSC in which a thin color pixel is required, a blue color filter layer can be formed as multiple layers in order to implement color reproduction, so that a thin color pixel can be formed. Thus, the implementation of uniform color reproduction and the peeling of the color filter layer can be prevented, so that stable colors can be implemented.

DETAILED DESCRIPTION OF THE INVENTION

Figure 1A:
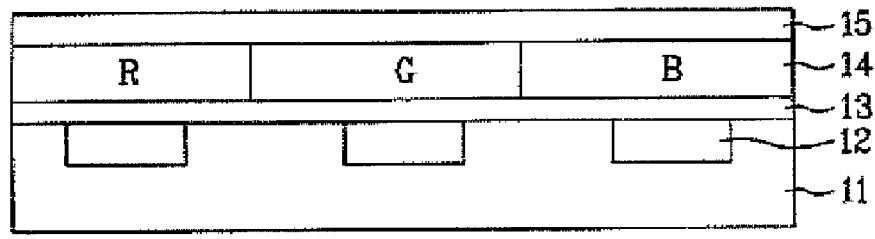
FIGS. 1a to 1d are cross-sectional views illustrating the procedure of manufacturing a conventional CMOS image sensor.
Figure 1B:
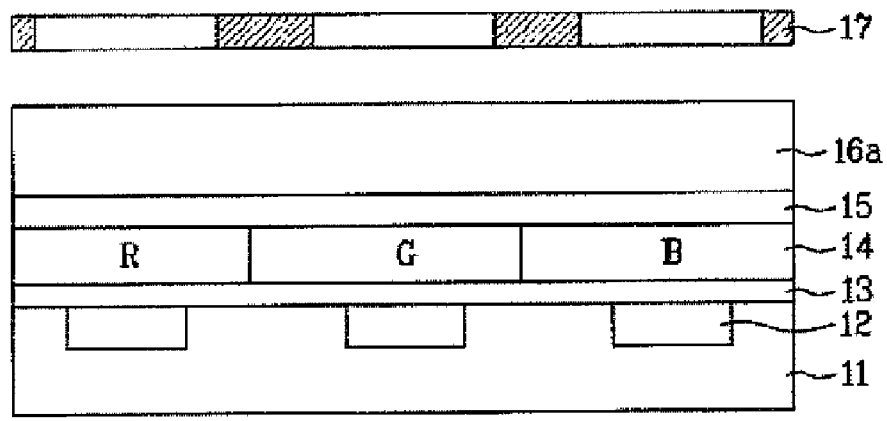
Figure 1C:
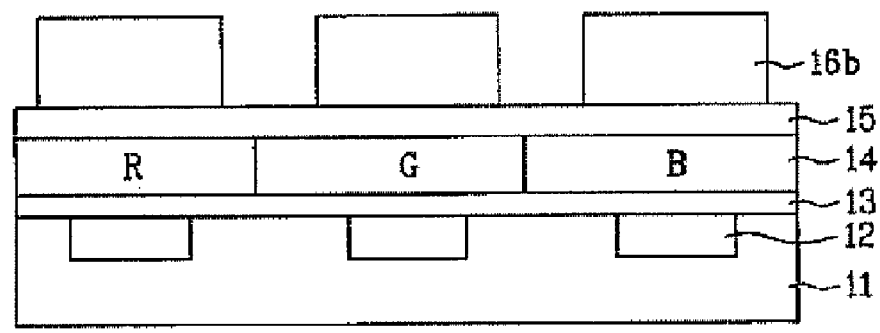
Figure 1D:
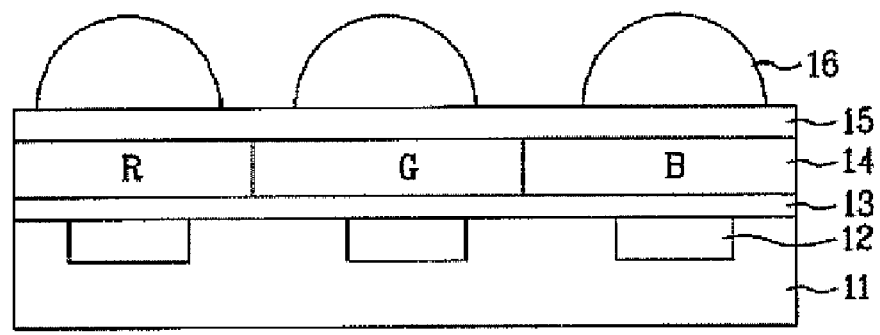
Figure 2:
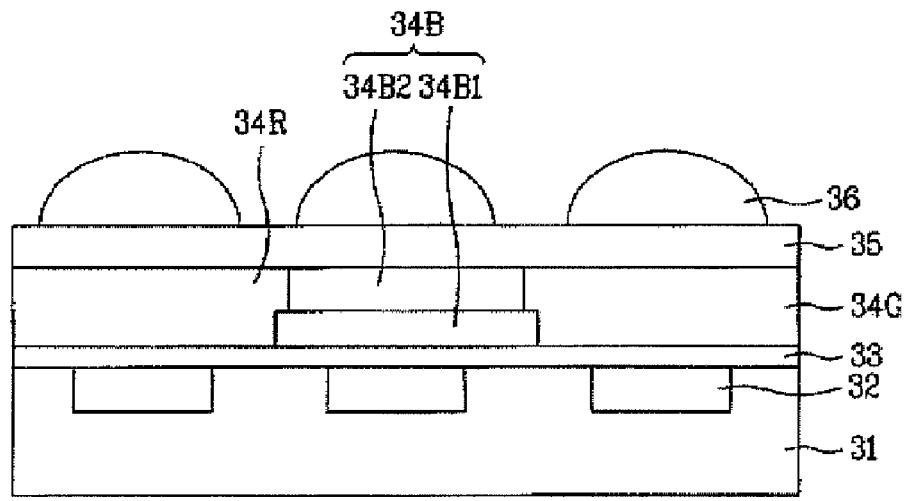
FIG. 2 is a cross-sectional view illustrating the structure of a CMOS image sensor according to an embodiment of the present invention.

FIG. 2 is a cross-sectional view illustrating a structure of a CMOS image sensor according to an embodiment of the present invention.

Referring to FIG. 2, the CMOS image sensor according to an embodiment of the present invention can include photodiodes 32, at least one of which is formed on a semiconductor substrate 31 to generate electric charges according to an amount of incident light; an interlayer dielectric layer 33 formed on an entire surface of the semiconductor substrate 31 including the photodiodes 32; color filter layers including a red color filter layer 34R, a multi-layered blue color filter layer 34B and a green color filter layer 34G formed on the interlayer dielectric layer 33 corresponding to the photodiodes 32 so as to allow light having specific wavelength bands to be irradiated onto the photodiodes 32; a planarization layer 35 formed on the entire surface of the semiconductor substrate 31 having the color filter layers; and microlenses 36 formed on the planarization layer 35 corresponding to the photodiodes 32 so as to guide light onto the photodiodes 32.

The microlens 36 can be formed in a convex hemispherical shape.

The color filter layer can include red and green color filter layers 34R and 34G formed as a single layer and a blue color filter layer 34B formed as double layers 34B1 and 34B2 on the interlayer insulating layer 33.

In the double blue color filter layer 34B, a first blue color filter layer 34B1 can be formed to a thickness of 0.8 to 0.9 μm on a blue color filter layer area of the interlayer dielectric layer 33 by a dyeable resist coating/exposure/development process.

In addition, in the blue color filter layer 34B, a second blue color filter layer 34B2 can be formed having the same thickness as the first blue color filter layer 34B1 on the first blue color filter layer 34B1 by a dyeable resist coating/exposure/development process.

To increase the overlay degree of the first and second blue color filter layers 34B1 and 34B2, the size (width and length) of the second blue color filter layer 34B2 can be formed to be smaller than that of the first blue color filter layer 34B1. In a specific embodiment, when forming the second blue color filter layer 34B2, misalignment can be prevented by allowing exposure energy to be smaller by about 5 to 10% than when forming the first blue color filter layer 34B1. Here, the overlay degree of the first and second blue color filter layers 34B1 and 34B2 can be set to be about ±5% of the size of a pixel.

That is, in a CMOS image sensor according to a preferred embodiment of the present invention used for a DSC in which a thin color pixel is required, the blue color filter layer is formed as multiple layers in order to implement color reproduction, so that a thin color pixel can be formed. Thus, the implementation of uniform color reproduction and the peeling of the color filter layer can be prevented, so that stable colors can be implemented.

FIGS. 3a to 3g are cross-sectional views illustrating a procedure for manufacturing a CMOS image sensor according to an embodiment of the present invention.

Figure 3A:
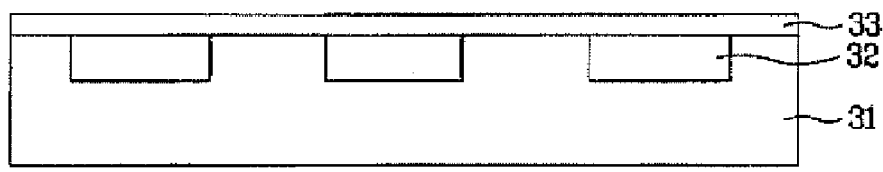
FIGS. 3a to 3g are cross-sectional views illustrating a procedure for manufacturing a CMOS image sensor according to an embodiment of the present invention.

Referring to FIG. 3a, an interlayer dielectric layer 33 can be formed on a semiconductor substrate 31 having a plurality of light sensing elements, e.g., photodiodes 32.

In an embodiment, the interlayer dielectric layer 33 may be formed as multiple layers. Although not shown in the figure, after one interlayer dielectric layer is formed, a light shielding layer is formed to prevent light from being incident onto unintended regions not having the photodiodes 32, and then another interlayer dielectric layer is formed thereupon.

Figure 3B:
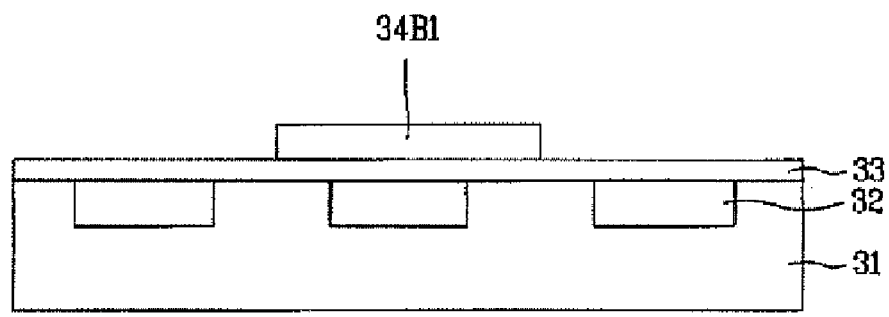

Referring to FIG. 3b, a dyeable resist can be applied on a blue color filter layer area of the interlayer dielectric layer 33, and a first blue color filter layer 34B1 for filtering light in a blue wavelength band can then be formed by performing an exposure and development process.

Figure 3C:
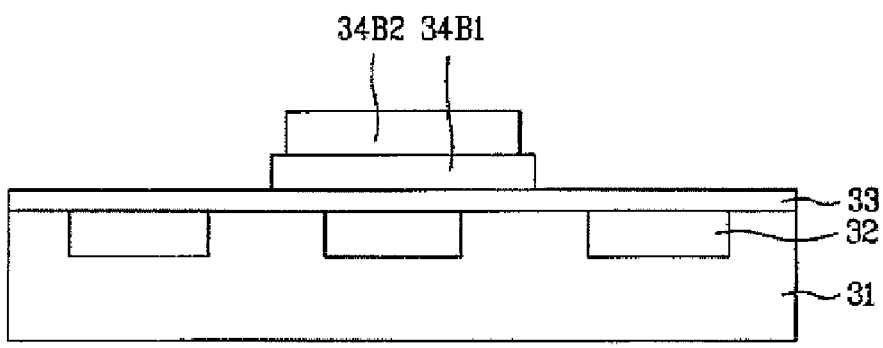

Subsequently, referring to FIG. 3c, a dyeable resist can be applied on the first blue color filter layer 34B1, and a second blue color filter layer 34B2 for filtering light in a blue wavelength band can then be formed by performing an exposure and development process. To increase an overlay degree of the first and second blue color filter layers 34B1 and 34B2, the size of the second blue color filter layer 34B2 is formed to be smaller than that of the first blue color filter layer 34B 1. To this end, when forming the second blue color filter layer 34B2, misalignment can be prevented by allowing exposure energy to be smaller by about 5 to 10% or so than when forming the first blue color filter layer 34B1. In a specific embodiment, the overlay degree of the first and second blue color filter layers 34B1 and 34B2 can be set to be about ±5% of the size of a pixel.

Figure 3D:
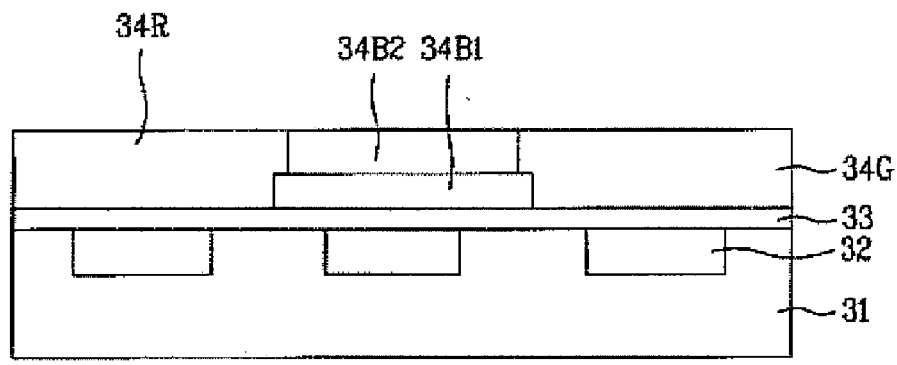

Subsequently, referring to FIG. 3d, a dyeable resist can be applied on a red color filter layer area of the interlayer dielectric layer 33, and a red color filter layer 34R for filtering light in a red wavelength band can then be formed by performing an exposure and development process.

A dyeable resist can be applied on a green color filter layer area of the interlayer dielectric layer 33, and a green color filter layer 34G for filtering light in a green wavelength band can then be formed by performing an exposure and development process.

Figure 3E:
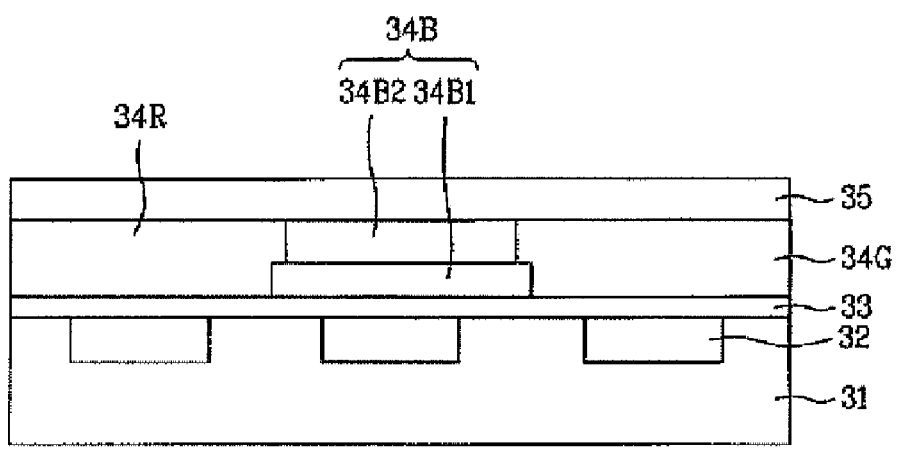

Subsequently, referring to FIG. 3e, a planarization layer 15 can be formed on the entire surface of the semiconductor substrate 31 having the color filter layers in order to adjust a focus distance and secure a planarity for forming a lens layer.

Meanwhile, since optical transmission is very important in an image sensor, the planarization layer 35 can be formed to have a thickness of 1000 to 6000 Å so as to eliminate an interference phenomenon of thin films due to the thickness thereof.

Figure 3F:
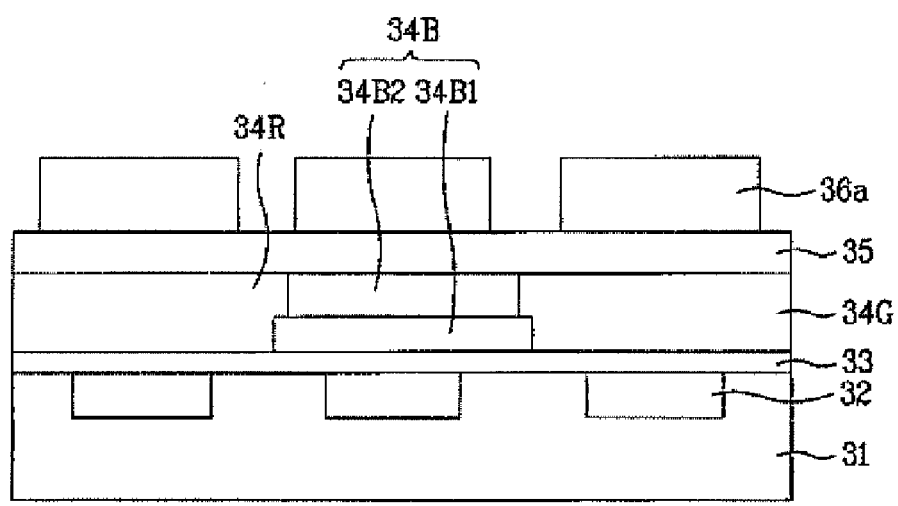

Subsequently, referring to FIG. 3f, a photoresist for microlenses can be coated on the entire surface of the semiconductor substrate 31 having the planarization layer 35, and the photoresist for microlenses can be selectively patterned by an exposure and development process, to form microlens patterns 36a.

Figure 3G:
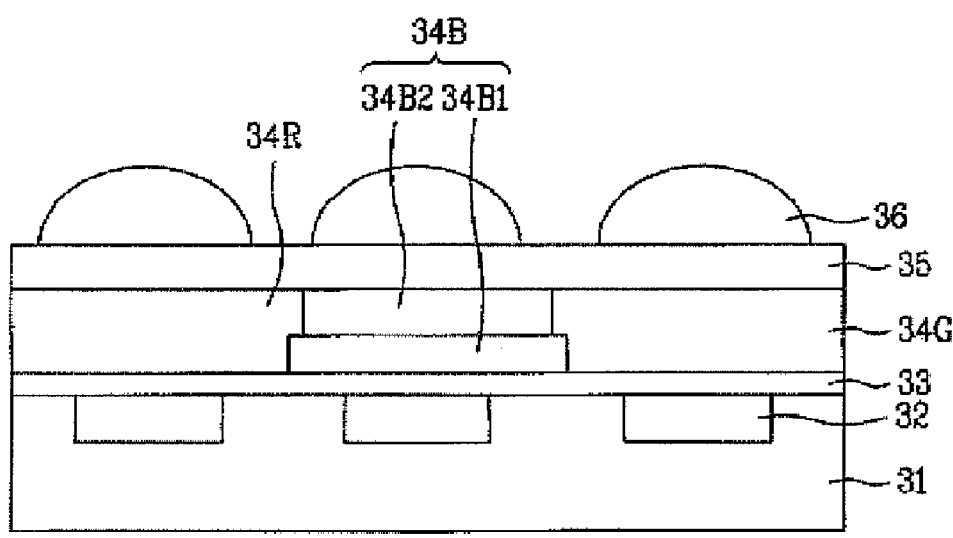

Then, referring to FIG. 3g, convex shaped microlenses 36 can be formed by reflowing the microlens patterns 37 at a temperature of 150 to 200° C. In one embodiment, the microlenses 36 can have a hemispherical shape.

The micro lenses 36 allow a larger amount of light to be focused onto the photodiodes 32 through the respective color filter layers according to the wavelengths thereof, when a natural light is incident into the micro lenses 36.

A CMOS image sensor and a method for manufacturing the same according to embodiments of the present invention have advantages as follows.

That is, in the CMOS image sensor used for a DSC in which a thin color pixel is required, a blue color filter layer can be formed as multiple layers in order to implement color reproduction, so that a thin color pixel can be formed. Thus, the implementation of uniform color reproduction and the peeling of the color filter layer can be prevented, so that stable colors can be implemented.

The embodiment and the accompanying drawings illustrated and described therein are intended to not limit the present invention, and it will be obvious to those skilled in the art that various changes, variations and modifications can be made to the present invention without departing from the technical spirit of the invention.

I claim:

1. A CMOS image sensor, comprising:
   a plurality of photodiodes formed on a semiconductor substrate;
   an interlayer dielectric layer formed on the semiconductor substrate having the plurality of photodiodes;
   color filter layers comprising a multi-layered blue color filter layer formed on the interlayer dielectric layer corresponding to respective photodiodes of the plurality of photodiodes on the interlayer dielectric layer, wherein the multi-layered blue color filter layer comprises a first blue color filter layer formed on the interlayer dielectric layer and a second blue color filter layer formed on the first blue color filter layer, wherein the first blue color filter layer is above the semiconductor substrate and the second blue color filter layer is above the first blue color filter layer, wherein a width of the second blue color filter layer is smaller than that of the first blue color filter layer;
   a planarization layer formed on the semiconductor substrate having the color filter layers; and
   microlenses formed on the planarization layer.

2. The CMOS image sensor of claim 1, wherein the color filter layers comprise the multi-layered blue color filter layer and a single-layered red color filter layer and a single-layered green color filter layer.

3. The CMOS image sensor of claim 1, wherein an overlay degree of the first and second blue color filter layers is about ±5% of a size of a pixel.

4. A method for manufacturing a CMOS image sensor, comprising:
   forming an interlayer dielectric layer on a semiconductor substrate having a plurality of photodiodes;
   forming color filter layers comprising a multi-layered blue color filter layer on the interlayer dielectric layer corresponding to respective photodiodes of the plurality of photodiodes, wherein forming the multi-layered color filter comprises forming a first blue color filter layer on the interlayer dielectric layer and forming a second blue color filter layer on the first blue color filter layer, wherein the first blue color filter layer is above the semiconductor substrate and the second blue color filter layer above the first blue color filter layer, wherein a width of the second blue color filter layer is smaller than that of the first blue color filter layer;
   forming a planarization layer on the semiconductor substrate having the color filter layers; and
   forming microlenses on the planarization layer.

5. The CMOS image sensor of claim 4, wherein forming the color filter layers comprises:
   forming the multi-layered blue color filter layer on the interlayer dielectric layer; and
   forming a red color filter layer and a green color filter layer on the interlayer dielectric layer.

6. The method of claim 4, wherein an overlay degree of the first and second blue color filter layers is about ±5% of a size of a pixel.

* * * * *